United States Patent
Ito et al.

(10) Patent No.: US 9,991,159 B2
(45) Date of Patent: Jun. 5, 2018

(54) SEMICONDUCTOR DEVICE MANUFACTURE METHOD

(71) Applicant: TOSHIBA MEMORY CORPORATION, Minato-ku, Tokyo (JP)

(72) Inventors: Fuyuma Ito, Mie (JP); Yasuhito Yoshimizu, Mie (JP); Yuya Akeboshi, Mie (JP); Hisashi Okuchi, Mie (JP); Masayuki Kitamura, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/449,233

(22) Filed: Mar. 3, 2017

(65) Prior Publication Data

US 2018/0082893 A1    Mar. 22, 2018

(30) Foreign Application Priority Data

Sep. 21, 2016    (JP) ................................ 2016-184585

(51) Int. Cl.
*H01L 21/768*    (2006.01)
*H01L 21/027*    (2006.01)
(Continued)

(52) U.S. Cl.
CPC .... *H01L 21/76879* (2013.01); *H01L 21/0272* (2013.01); *H01L 21/0273* (2013.01);
(Continued)

(58) Field of Classification Search
CPC .................... H01L 21/76879; H01L 21/7688
See application file for complete search history.

(56) References Cited

U.S. PATENT DOCUMENTS

| | | | |
|---|---|---|---|
| 6,440,763 B1 * | 8/2002 | Hsu | ........................ B82Y 10/00 |
| | | | 438/20 |
| 8,907,484 B2 | 12/2014 | Kitamura et al. | |

(Continued)

FOREIGN PATENT DOCUMENTS

| | | |
|---|---|---|
| JP | H07-202382 A | 8/1995 |
| JP | 2002-299343 A | 10/2002 |

OTHER PUBLICATIONS

Steinhoegl, et al.: "Scaling Laws for the Resistivity Increase of sub-100nm Interconnects", Corporate Research, Infincon Technologies AG, Muenchen, Germany, 2003, pp. 27-30.

*Primary Examiner* — Dung Le
(74) *Attorney, Agent, or Firm* — Foley & Lardner LLP

(57) ABSTRACT

According to some embodiments, a semiconductor device manufacturing method includes forming a sacrificial film on a material film. The method includes processing the sacrificial film, and forming a first groove in the sacrificial film having a first width and a second groove in the sacrificial film having a second width larger than the first width, the material film defining a base of the first groove and a base of the second groove. The method includes forming a catalyst layer on the sacrificial film, and on the base of the first groove and the base of the second groove. The method includes forming a first metal film having a thickness equal to or larger than half the first width and smaller than half the second width on the catalyst layer by plating. The method includes removing at least a portion of the first metal film in the second groove while leaving a portion of the first metal film in the first groove unremoved. The method includes removing the catalyst layer on the sacrificial film while leaving the catalyst layer on the base of the second groove unremoved. The method includes forming a second metal film in the second groove by the plating.

8 Claims, 5 Drawing Sheets

(51) Int. Cl.
    *H01L 23/522*     (2006.01)
    *H01L 23/532*     (2006.01)

(52) U.S. Cl.
    CPC .. *H01L 21/76802* (2013.01); *H01L 21/76831* (2013.01); *H01L 23/5226* (2013.01); *H01L 23/53238* (2013.01)

(56) References Cited

U.S. PATENT DOCUMENTS

| | | |
|---|---|---|
| 2007/0218192 A1 | 9/2007 | Kimura et al. |
| 2012/0049370 A1* | 3/2012 | Wada .................... B82Y 10/00 257/751 |

\* cited by examiner

SEMICONDUCTOR DEVICE MANUFACTURE METHOD

This application claims the benefit of and priority to Japanese Patent Application No. 2016-184585, filed Sep. 21, 2016, the entire contents of which are incorporated herein by reference.

FIELD

Embodiments described herein relate generally to a semiconductor device manufacturing method and a semiconductor manufacturing apparatus.

BACKGROUND

A semiconductor device such as a semiconductor memory can include a memory cell region and a peripheral circuit region which controls memory cells, both within one chip. The memory cell region can be miniaturized so as to increase the capacity of a semiconductor memory. Interconnects leading out from the memory cell region can be miniaturized. Miniaturizing the interconnects of the memory cell region can cause an increase in resistances of the interconnects, a delay in the transfer of data and control signals, and an increase in heat generation due to the interconnect resistances. To suppress such an increase in interconnect resistances, a metal having a short electron mean free path can be used. In this case, however, a problem can arise that the resistance of a relatively thick interconnect leading out from the peripheral circuit region increases.

Furthermore, different interconnect materials between the memory cell region and the peripheral circuit region can be used. In such a case, however, it may be necessary to repeatedly execute lithography steps and etching steps in order to form interconnects in the memory cell region and peripheral circuit region, respectively. As a result, manufacturing costs can increase.

DETAILED DESCRIPTION

This disclosure describes some embodiments of a semiconductor device manufacturing method and a semiconductor manufacturing apparatus capable of forming low resistance interconnects both in a memory cell region and in a peripheral circuit region at a low cost.

In general, according to some embodiments, a semiconductor device manufacturing method includes forming a sacrificial film on a material film. The method includes processing the sacrificial film, and forming a first groove having a first width and a second groove having a second width larger than the first width. The method includes forming a catalyst layer on the sacrificial film and on the material film. The method includes forming a first metal film having a thickness equal to or larger than half the first width and smaller than half the second width on the catalyst layer by plating. The method includes removing the first metal film in the second groove while leaving the first metal film in the first groove unremoved. The method includes removing the catalyst layer on the sacrificial film while leaving the catalyst layer on the material film unremoved. The method includes forming a second metal film in the second groove by plating.

Embodiments according to the present disclosure will be described hereinafter with reference to the drawings. The present disclosure is not limited to the embodiments described herein. In the following described embodiments, a "vertical direction" and an "upper" surface refer to a vertical direction and an upper surface, respectively, as depicted in the Figures. Thus the vertical direction may refer to a direction which differs from a vertical direction defined by an acceleration of an object due to gravity. Further, an upper surface may refer to a surface of a semiconductor device, as depicted in the Figures, regardless of an actual orientation of the device.

Figure 1:
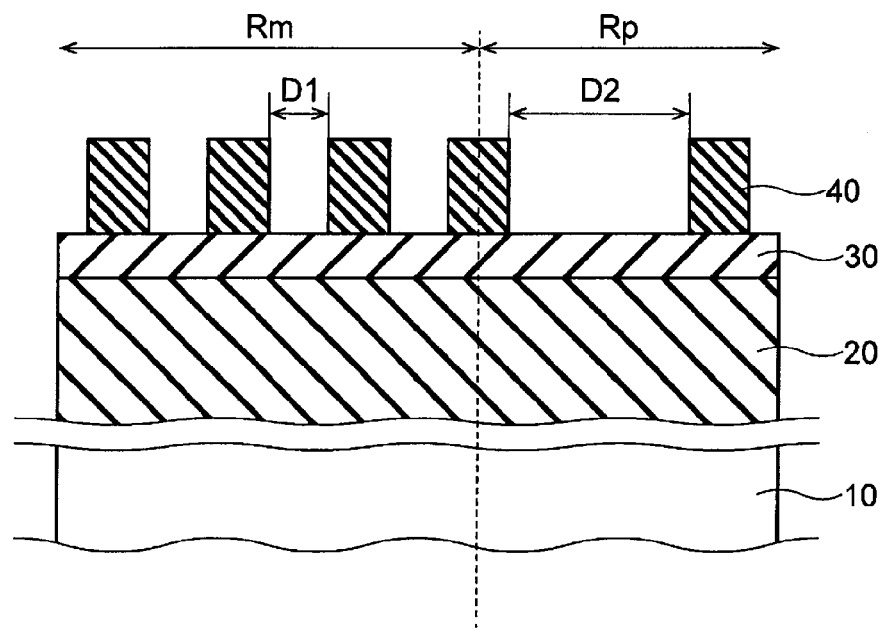
FIG. 1 is a cross-sectional illustration showing a step of an example of a semiconductor device manufacturing method according to some embodiments of the present disclosure.

FIGS. 1 to 8 are cross-sectional illustrations of an example of steps of a semiconductor device manufacturing method according to some embodiments of the present disclosure. In some presently described embodiments, a plurality of metal interconnects different in interconnect extension or size (e.g. width or length of an interconnect) and type are formed in a same layer in a memory cell region Rm and in a peripheral circuit region Rp, respectively, in order to keep interconnect resistances small in the memory cell region Rm and in the peripheral circuit region Rp. A semiconductor substrate 10 such as, for example, a silicon substrate, can be provided, as shown in FIG. 1. The semiconductor substrate 10 includes a memory cell region Rm and a peripheral circuit region Rp. The memory cell region Rm of the semiconductor substrate 10 is a region where memory elements (not shown) may be formed in an array configuration, for example. The peripheral circuit region Rp is a region where semiconductor elements (not shown)

constituting peripheral circuits, such as peripheral circuits for driving or controlling the memory elements, may be disposed.

An interlayer insulating film 20 is formed above the semiconductor substrate 10. As shown in FIG. 1, the interlayer insulating film 20 covers the memory elements and the peripheral circuits. For example, an insulating film such as a silicon oxide film is used as the interlayer insulating film 20. A material film 30 is formed on the interlayer insulating film 20. For example, an insulating film such as a silicon nitride film is used as the material film 30.

As shown in FIG. 1, a sacrificial film 40 is formed on the material film 30 using a lithography technique. For example, a photoresist film is used as the sacrificial film 40. The sacrificial film 40 is processed (e.g. deposited and/or patterned) on the material film 30 by the lithography technique. In the memory cell region Rm, the sacrificial film 40 is processed into a first line pattern in which lines are arranged at intervals of a first distance D1. In the peripheral circuit region Rp, the sacrificial film 40 is processed into a second line pattern in which lines are arranged at intervals of a second distance D2. The second distance D2 is larger than the first distance D1. Spaces between portions of the sacrificial film 40 (having, for example, lengths or widths D1 or D2) may be referred to herein as "grooves" of the sacrificial film 40. Such grooves may contain substantially no sacrificial film material. A bottom or base of each groove may be defined by at least a portion of the material film 30.

Figure 2:
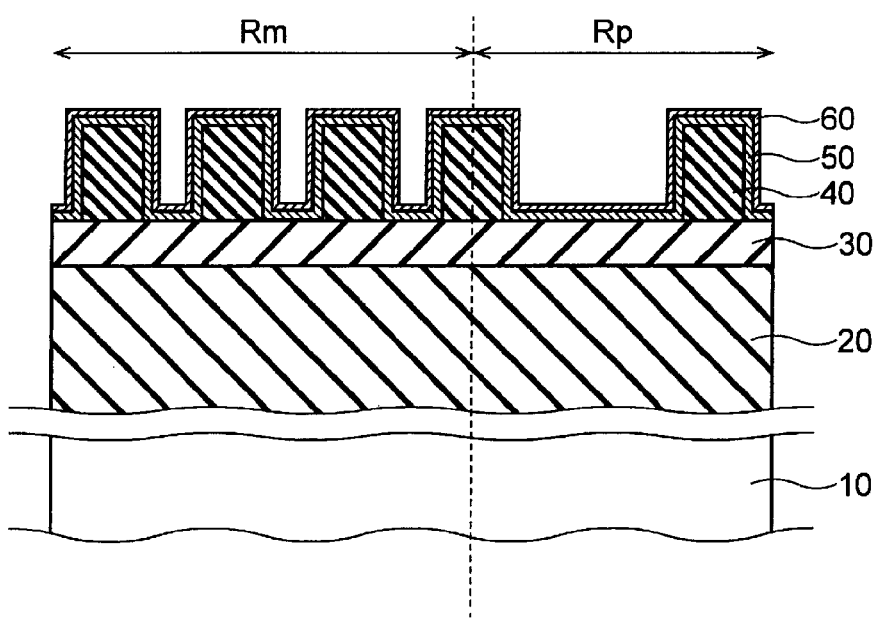
FIG. 2 is a cross-sectional illustration of a step subsequent to the step illustrated in FIG. 1 of the semiconductor device manufacturing method according to some embodiments of the present disclosure.

Next, as shown in FIG. 2, a self-assembled monolayer (SAM) film 50 is formed on the sacrificial film 40 and on the material film 30. The SAM film 50 is an organic molecular film that allows a catalyst layer, to be described later, to be readily attached to the SAM film 50. The SAM film 50 is formed by immersing the semiconductor substrate 10 in an SAM-containing organic molecular solution.

A catalyst layer 60, which can function as a catalyst in electroless plating, is then formed on the SAM film 50. For example, one or more of palladium (Pd), platinum (Pt) or cobalt (Co) is used for the catalyst layer 60. The catalyst layer 60 is formed by immersing the semiconductor substrate 10 in a catalyst solution. The SAM film 50 allows the catalyst layer 60 to be stably attached onto the sacrificial film 40 and the material film 30.

Figure 3:
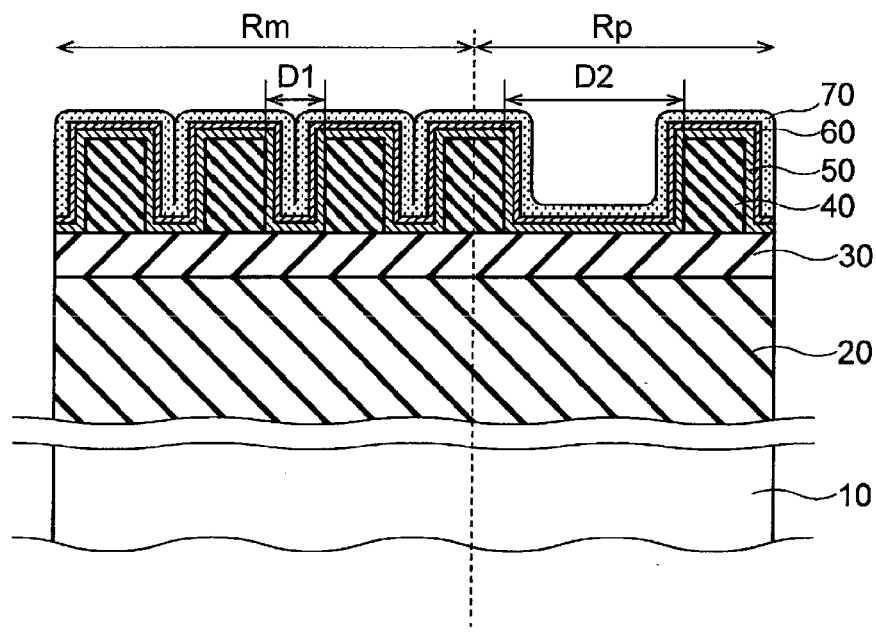
FIG. 3 is a cross-sectional illustration of a step subsequent to the step illustrated in FIG. 2 of the semiconductor device manufacturing method according to some embodiments of the present disclosure.

As shown in FIG. 3, a first metal film 70 is then deposited on the catalyst layer 60 using electroless plating. The first metal film 70 is formed from a metallic material having a shorter electron mean free path than a metallic material used in a second metal film 80 to be described later. For example, nickel is used for the first metal film 70 when copper, for example, is used for the second metal film 80. Other materials may be used in addition to the metallic materials having the above-described characteristics. For example, the first metal film 70 may be formed of a majority (e.g. by weight) of nickel and may further include other materials, and/or the second metal film 80 may be formed of a majority (e.g. by weight) of copper and may further include other materials. A reason for using the different metallic materials between the first metal film 70 and the second metal film 80 will be described later. The first metal film 70 is deposited electrolessly with the catalyst layer 60 used as the catalyst by immersing the semiconductor substrate 10 in an electroless nickel plating solution or the like.

The first metal film 70 has a thickness about equal to or larger than about half of a space width (first distance D1) of the sacrificial film 40 in the memory cell region Rm, corresponding to a first line pattern region, and smaller than about half of a space width (second distance D2) of the sacrificial film 40 in the peripheral circuit region Rp, corresponding to a second line pattern region. As shown in FIG. 3, the first metal film 70, which has the above-mentioned thickness, buries or fills in space regions between patterned parts of the sacrificial film 40 in the memory cell region Rm (e.g. fills in the spaces nearly completely or completely), but does not completely fill in space regions between patterned portions of the sacrificial film 40 in the peripheral circuit region Rp.

Figure 4:
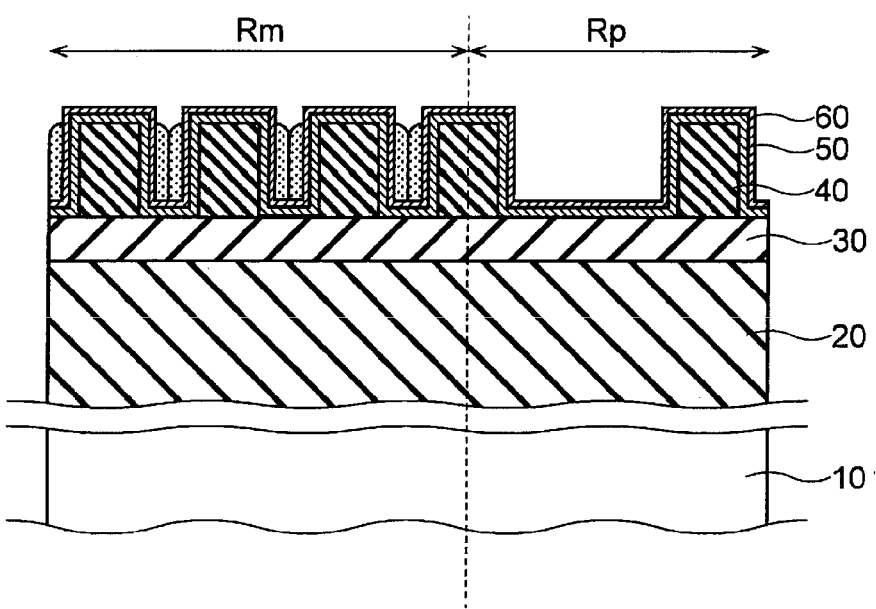
FIG. 4 is a cross-sectional illustration of a step subsequent to the step illustrated in FIG. 3 of the semiconductor device manufacturing method according to some embodiments of the present disclosure.

As shown in FIG. 4, a portion of the first metal film 70 is then etched using wet etching. The nickel film or the like serving as the first metal film 70 is etched using, for example, an acid etching solution such as a nitric acid solution or a hydrogen peroxide solution. The first metal film 70 in the space regions of the peripheral circuit region Rp is thereby removed while leaving the first metal film 70 in the space regions of the memory cell region Rm unremoved. The catalyst layer 60 on an upper surface of the sacrificial film 40 in the memory cell region Rm and the catalyst layer 60 on the material film 30 in the peripheral circuit region Rp (e.g. in space regions in the Rp region) are thereby exposed. The remaining first metal film 70 can function as metal interconnects in the memory cell region Rm.

Figure 5:
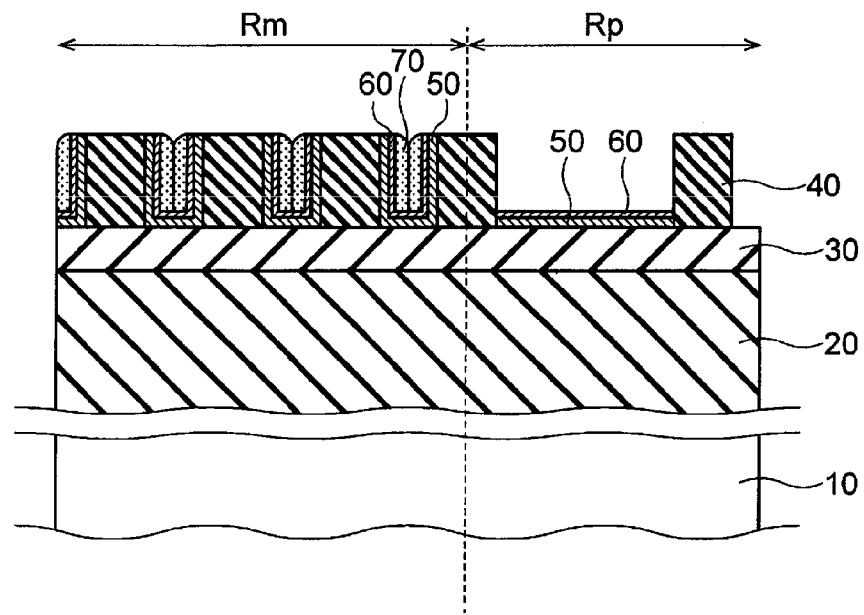
FIG. 5 is a cross-sectional illustration of a step subsequent to the step illustrated in FIG. 4 of the semiconductor device manufacturing method according to some embodiments of the present disclosure.

As shown in FIG. 5, at least a portion of an upper surface of the sacrificial film 40 as well as a portion of the catalyst layer 60 and/or a portion of the SAM layer 50 on the sacrificial film 40 is then removed using wet etching. The upper surface of the sacrificial film 40 is slightly etched using, for example, an organic solvent such as alcohol or an alkaline aqueous solution. It is thereby possible to selectively remove the catalyst layer 60 and the SAM film 50 on the sacrificial film 40 while leaving the catalyst layer 60 and the SAM film 50 on the material film 30 (e.g. in space regions in the Rm region between patterned portions of the sacrificial film 40 in the Rm region) unremoved. That is, the exposed catalyst layer 60 on the sacrificial film 40, as shown in FIG. 4, is removed (subjected to lift-off) together with a part of the sacrificial film 40 and the SAM film 50. It is noted that at least some of the catalyst layer 60 disposed between the SAM layer 50 and the first metal film 70 between patterned portions of the sacrificial film 40 in the Rm region remains on side surfaces of the sacrificial film 40.

Figure 6:
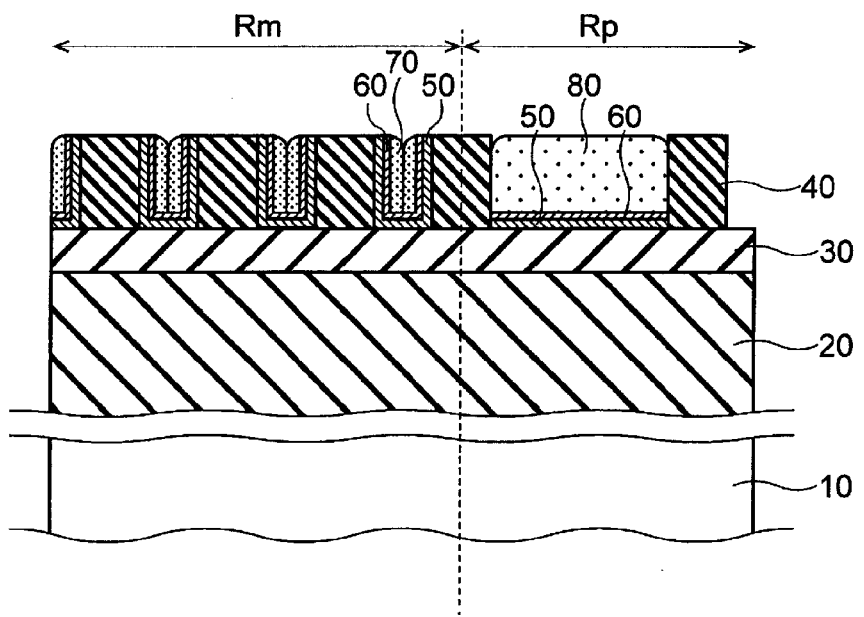
FIG. 6 is a cross-sectional illustration of a step subsequent to the step illustrated in FIG. 5 of the semiconductor device manufacturing method according to some embodiments of the present disclosure.

As shown in FIG. 6, a second metal film 80 is then deposited on the catalyst layer 60 exposed in the space regions of the peripheral circuit region Rp using electroless plating. The second metal film 80 is formed from a metallic material having a longer electron mean free path than does the metal material of the first metal film 70. For example, copper or the like is used for the second metal film 80 when nickel, for example, is used for the first metal film 70. The second metal film 80 is deposited electrolessly with the catalyst layer 60 used as a catalyst by immersing the semiconductor substrate 10 in an electroless nickel plating solution or the like. It is noted that the catalyst layer 60 is exposed in the space regions of the peripheral circuit region Rp but is not exposed in the space regions of the memory cell region Rm. Therefore, it is possible to selectively deposit the second metal film 80 in the space regions of the peripheral circuit region Rp. The second metal film 80 can function as metal interconnects in the peripheral circuit region Rp.

Figure 7:
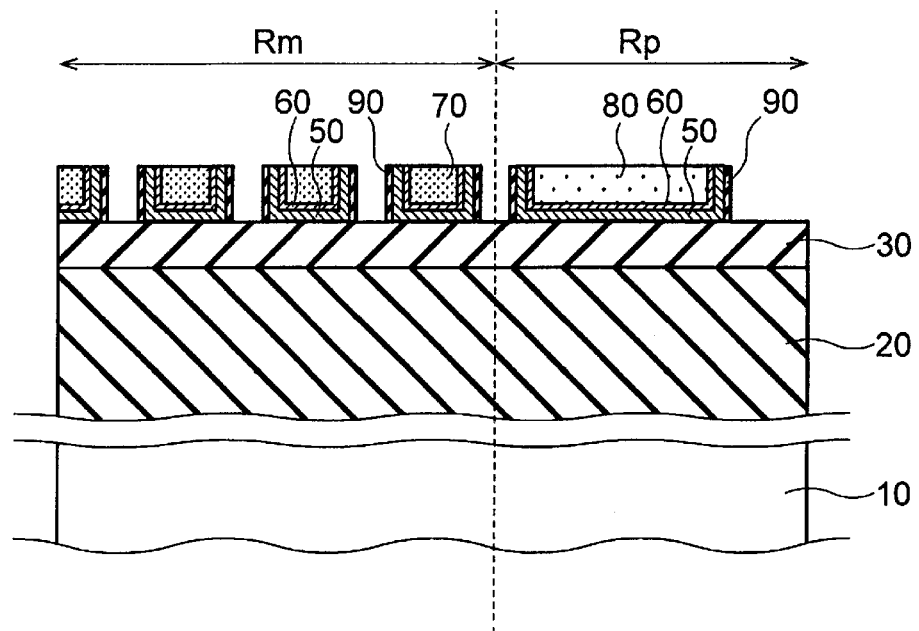
FIG. 7 is a cross-sectional illustration of a step subsequent to the step illustrated in FIG. 6 of the semiconductor device manufacturing method according to some embodiments of the present disclosure.

As shown in FIG. 7, the sacrificial film 40 is then removed using wet etching. The sacrificial film 40 is removed using, for example, an organic solvent such as alcohol or an alkaline aqueous solution.

A covering film 90 is then formed in such a manner as to cover side surfaces of the first and second metal films 70 and 80 (e.g. cover side surfaces of at least portions of the SAM film 50 which in turn cover side surfaces of the first and second metal films 70 and 80). For example, the covering film 90 is formed on the side surfaces of the first and second metal films 70 and 80 by depositing the covering film 90 and then etching the covering film 90. For example, a silicon nitride film is used as the covering film 90. The covering film 90 can function as a diffusion suppression film for suppressing diffusion of the first and second metal films 70 and 80. The material film 30 may be formed from, for example, a similar or identical silicon nitride film. Therefore, the first and second metal films 70 and 80 are surrounded by the silicon nitride films (the covering film 90 and the material film 30) along four directions. It is thereby possible to further suppress diffusion of the first and second metal films 70 and 80.

Figure 8:
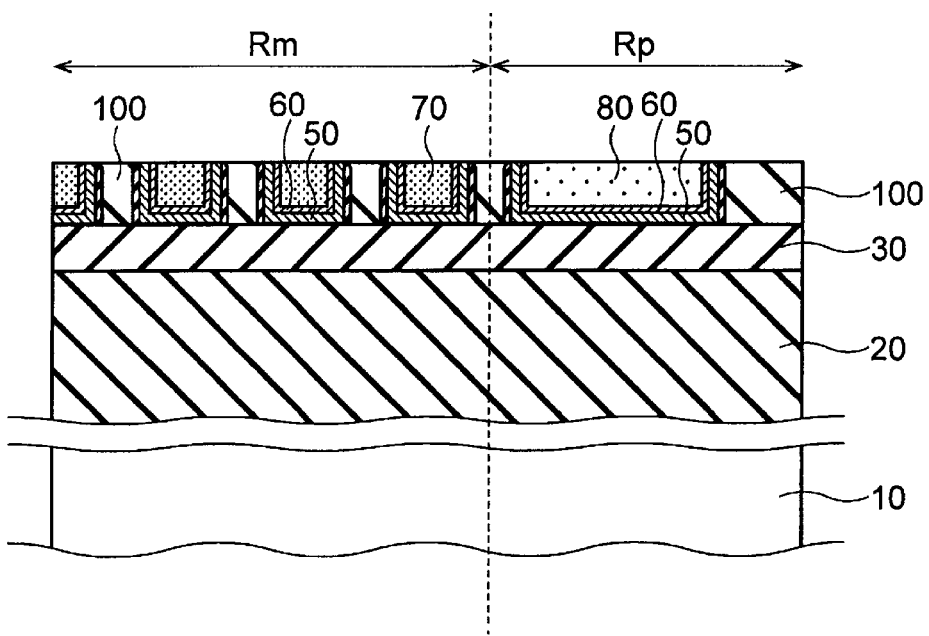
FIG. 8 is a cross-sectional illustration of a step subsequent to the step illustrated in FIG. 7 of the semiconductor device manufacturing method according to some embodiments of the present disclosure.

Next, a material of an interlayer insulating film 100 is deposited and the material of the interlayer insulating film 100 is planarized. As shown in FIG. 8, the interlayer insulating film 100 is thereby buried among (e.g. formed such that it fills spaces between) the interconnects formed by the first and second metal films 70 and 80. For example, an insulating film such as a silicon oxide film is used as the interlayer insulating film 100. Subsequently, a semiconductor device is completed by forming interlayer insulating films, interconnects, and the like (not shown).

In some embodiments, the first metal film 70 in the memory cell region Rm is formed from a metallic material having a shorter electron mean free path than does a metallic material of the second metal film 80 in the peripheral circuit region Rp. One advantage of using the different metallic materials having these characteristics for the first metal film 70 and the second metal film 80 is as follows.

If the capacity of a semiconductor memory is to be enlarged, it may be helpful to miniaturize the interconnects in the memory cell region Rm to a greater degree than miniaturization of the interconnects in the peripheral circuit region Rp. Copper having high thermal conductivity and low specific resistance can be used for interconnects electrically connecting semiconductor elements. However, when an interconnect width decreases to be equal to or smaller than a certain value (for example, about 40 nm), the specific resistance of the copper rapidly increases. This is a phenomenon called line width shrinkage effect. The line width shrinkage effect occurs when the interconnect width decreases to be equal to a value on the order of (e.g. about equal to or smaller than) an electron mean free path of the copper, and a ratio of electron scattering on sidewalls of an interconnect relative to lattice scattering increases in copper crystals. For example, the electron mean free path due to the lattice scattering in the copper is about 40 nm. Owing to this, when the interconnect width decreases to be, for example, equal to or smaller than about 40 nm, the specific resistance of the copper rapidly increases. Thus, when the copper is used for the first metal film 70 in the memory cell region Rm and the interconnect width becomes, for example, equal to or smaller than about 40 nm, the specific resistance of interconnects is high.

A semiconductor memory device according to some embodiments described herein uses a metal for the first metal film 70 having a shorter electron mean free path than does a metal (e.g. copper) used for the second metal film 80. For example, the metallic material such as nickel, having a shorter electron mean free path than copper, is used for the first metal film 70. For the metal having the shorter electron mean free path, the interconnect width at which the specific resistance of the interconnect starts to increase as described above (interconnect width at which the line width shrinkage effect becomes conspicuous) is smaller, and thus the metal can be suitable for use in an interconnect having a small interconnect width.

On the other hand, when the interconnect width is sufficiently large, the specific resistance of the metal having the shorter electron mean free path is higher than the specific resistance of the metal having the longer electron mean free path. Therefore, in some embodiments, when the interconnect width in the peripheral circuit region Rp is larger than, for example, about 40 nm, copper, having a relatively long electron mean free path, is used for the second metal film 80 in the interconnect(s) of the peripheral circuit region Rp. The specific resistance of the interconnect(s) of the peripheral circuit region Rp is thereby reduced.

In this way, in some embodiments, it is possible to keep interconnect resistances small in the memory cell region Rm and the peripheral circuit region Rp by selecting, for the first and second metal films 70 and 80 being used for interconnects, materials according to the respective interconnect widths.

According to some embodiments, it is possible to use a lithography technique to form the sacrificial film 40, to form a plurality of types of metal interconnects different in interconnect width in a same layer (same plane) using electroless plating and wet etching, and to then form the interlayer insulating film 100. Thus, the first and second metal films 70 and 80 can be selectively formed using electroless plating and wet etching without using a combination of a lithography technique and a dry etching technique or a Chemical Mechanical Polishing (CMP). Electroless plating and wet etching can involve fewer steps and a lower cost than some combinations of lithography techniques and dry etching techniques or a CMP method.

Furthermore, if the combination of a lithography technique and a dry etching technique or CMP method is used, it may be necessary to repeat a lithography step, a dry etching step or a CMP step in order to form the different metal films in the memory cell region Rm and the peripheral circuit region Rp, respectively. According to the present embodiment, however, it is possible to dispense with repeating the lithography step, the dry etching step or the CMP step at least twice in order to form the first and second metal films 70 and 80. It is thereby possible to achieve further cost reduction.

Moreover, according to some embodiments, multiple wet treatment processes can be implemented between a step of forming the SAM film 50 (e.g. as shown in FIG. 2) to a step of removing the sacrificial film 40 (e.g. as shown in FIG. 7). By immersing the semiconductor substrate 10 in a plurality of solutions within one wet treatment apparatus, it is possible to readily process the semiconductor substrate 10 by performing wet treatment processes in a continuous manner within a single wet treatment apparatus. It is thereby possible to shorten a semiconductor device manufacturing process and achieve still further cost reduction.

(Semiconductor Manufacturing Apparatus)

Figure 9:
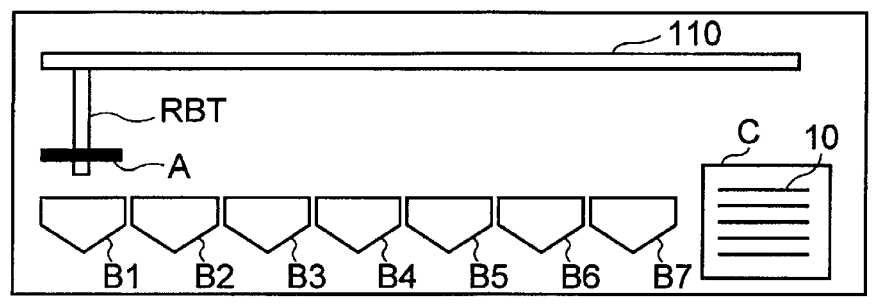
FIG. 9 is a schematic diagram illustrating an example of a configuration of a semiconductor manufacturing apparatus according to some embodiments of the present disclosure.

FIG. 9 is a schematic diagram illustrating an example of a configuration of a semiconductor manufacturing apparatus 101 according to some embodiments of the present disclosure. The semiconductor manufacturing apparatus 100 is, for example, a wet treatment apparatus, which can perform wet treatment processing including processes between a step of forming the SAM film 50 to a step of removing the sacrificial film 40, as described above.

The semiconductor manufacturing apparatus 101 includes first to seventh containers B1 to B7 and a delivery robot RBT. The first container B1 supplies an organic molecular solution which can be disposed onto the material film 30 and the sacrificial film 40 to form the SAM film 50. The organic molecular solution is, for example, a thiol derivative solution. The second container B2 supplies a catalyst solution, which can be disposed onto the SAM film 50 to form the catalyst layer 60. The catalyst solution is, for example, one or more of a palladium solution, a cobalt solution or a platinum solution. The third container B3 supplies a first electroless plating solution, which can be disposed onto the catalyst layer 60 to form the first metal film 70. The first electroless plating solution is, for example, an electroless nickel plating solution. The fourth container B4 supplies a first etching solution, which can be disposed onto the first metal film 70 to remove the first metal film 70. The first etching solution is, for example, a nitric acid solution or a hydrogen peroxide solution. The fifth container B5 supplies a second etching solution, which can be disposed onto the sacrificial film 40 to remove the sacrificial film 40. The second etching solution is, for example, an organic solvent or an alkaline aqueous solution. The sixth container B6 supplies a second electroless plating solution, which can be disposed onto the catalyst layer 60 to form the second metal film 80. The second electroless plating solution is, for example, an electroless copper plating solution. The seventh container B7 supplies the second etching solution, which can be disposed onto the sacrificial film 40 to remove the sacrificial film 40. The second etching solution is, for example, the same or similar to the organic solvent or the alkaline aqueous solution supplied by the fifth container B5.

It is noted that a plurality of solution supply methodologies may be appropriate for supplying solutions stored in any of the first to seventh containers B1 to B7 to a semiconductor substrate 10 and/or components and/or layers disposed thereon. The first to seventh containers B1 to B7 may be containers storing the abovementioned solutions. Each respective solution can be supplied to the semiconductor substrate 10 by immersing the semiconductor substrate 10 in each of the respective solutions stored in the first to seventh containers B1 to B7. Alternatively or additionally, the first to seventh containers B1 to B7 may respectively discharge the respective solutions onto an upper surface of the semiconductor substrate 10 from nozzles.

The first to seventh containers B1 to B7 may be single-wafer-processing containers for processing a single semiconductor substrate 10 at a time, or may be batch containers for processing a plurality of semiconductor substrates 10 simultaneously. The semiconductor manufacturing apparatus 101 will be described hereinafter as a semiconductor manufacturing apparatus 101 suitable for single-wafer-processing, but other types of semiconductor manufacturing apparatuses, such as those suitable for batch processing, may be implemented.

The delivery robot RBT can serve as a delivery mechanism or delivery section, and can move along a rail 110 which extends along a direction in which the first to seventh containers B1 to B7 are laid out (depicted as a horizontal direction in FIG. 9). The semiconductor substrate 10 can be mounted on an arm A of the delivery robot RBT. Furthermore, the delivery robot RBT can move the arm A in a vertical direction and in a horizontal direction. The delivery robot RBT can thereby unload the semiconductor substrate 10 from a wafer cassette C and deliver the semiconductor substrate 10 to any of the first to seventh containers B1 to B7. For example, the delivery robot RBT delivers the semiconductor substrate 10 to each container sequentially, in a consecutive order of the first container B1 through the seventh containers B7. Moreover, the delivery robot RBT can load the semiconductor substrate 10 into any of the first to seventh containers B1 to B7.

For example, in the step of forming the SAM film 50, the delivery robot RBT delivers the semiconductor substrate 10 from the wafer cassette C to the first container B1, and the SAM film 50 is formed in the first container B1.

Next, the delivery robot RBT delivers the semiconductor substrate 10 from the first container B1 to the second container B2, and the catalyst layer 60 is formed in the second container B2.

The delivery robot RBT then delivers the semiconductor substrate 10 from the second container B2 to the third container B3, and an electroless plating treatment is executed in the third container B3 to form the first metal film 70.

The delivery robot RBT then delivers the semiconductor substrate 10 from the third container B3 to the fourth container B4, and the first metal film 70 is etched in the fourth container B4.

The delivery robot RBT then delivers the semiconductor substrate 10 from the fourth container B4 to the fifth container B5, and the upper surface part of the sacrificial film 40 is etched and the catalyst layer 60 thereon is subjected to lift-off in the fifth container B5.

The delivery robot RBT then delivers the semiconductor substrate 10 from the fifth container B5 to the sixth container B6, and an electroless plating treatment is executed in the sixth container B6 to form the second metal film 80.

The delivery robot RBT then delivers the semiconductor substrate 10 from the sixth container B6 to the seventh container B7, and the sacrificial film 40 is etched in the seventh container B7. It is noted that the seventh container B7 may store the same or a similar second etching solution as that stored in the fifth container B5. Owing to this, the seventh container B7 may be omitted; instead, the delivery robot RBT may return the semiconductor substrate 10 from the sixth container B6 to the fifth container B5 so that the sacrificial film 40 is etched in the fifth container B5.

Next, the delivery robot RBT can deliver the semiconductor substrate 10 to the wafer cassette C.

As described so far, the semiconductor manufacturing apparatus 101 according to the present embodiment can continuously execute a series of processing steps from the step of forming the SAM film 50 to the step of removing the sacrificial film 40, within one apparatus. Therefore, it is possible to readily process the semiconductor substrate 10 from the step of forming the SAM film 50 to the step of removing the sacrificial film 40, which contributes to shortening the semiconductor device manufacturing process and achieving reduction of manufacturing cost.

As used herein, the terms "substantially," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device manufacturing method comprising:
   forming a sacrificial film on a material film;
   processing the sacrificial film, and forming a first groove in the sacrificial film having a first width and a second groove in the sacrificial film having a second width larger than the first width, the material film defining a base of the first groove and a base of the second groove;
   forming a catalyst layer on the sacrificial film, and on the base of the first groove and the base of the second groove;
   forming a first metal film having a thickness equal to or larger than half the first width, and smaller than half the second width, on the catalyst layer by plating;
   removing at least a portion of the first metal film in the second groove while leaving at least a portion of the first metal film in the first groove unremoved;
   removing the catalyst layer on the sacrificial film while leaving the catalyst layer on the base of the second groove unremoved; and
   forming a second metal film in the second groove by plating.

2. The semiconductor device manufacturing method according to claim 1,
   wherein the catalyst layer includes at least one of palladium, cobalt, or platinum,
   the first metal film includes nickel, and
   the second metal film includes copper.

3. The semiconductor device manufacturing method according to claim 1,
   wherein the first and second metal films are formed by electroless plating using the catalyst layer.

4. The semiconductor device manufacturing method according to claim 1, further comprising:
   after forming the second metal film, removing the sacrificial film; and
   forming a covering film on side surfaces of the first metal film and second metal film.

5. The semiconductor device manufacturing method according to claim 4, further comprising
   forming an organic molecular film on the sacrificial film and on the material film before forming the catalyst layer.

6. The semiconductor device manufacturing method according to claim 5, wherein the organic molecular film is a self-assembled monolayer film.

7. The semiconductor device manufacturing method according to claim 4,
   wherein the material film and the covering film each includes a silicon nitride film.

8. The semiconductor device manufacturing method according to claim 1,
   wherein the sacrificial film is a photoresist film.

* * * * *